(12) United States Patent
Utsunomiya

(10) Patent No.: US 10,483,223 B2
(45) Date of Patent: Nov. 19, 2019

(54) SEMICONDUCTOR DEVICE HAVING A LARGE AREA INTERCONNECT OR PAD

(71) Applicant: SII Semiconductor Corporation, Chiba-shi, Chiba (JP)

(72) Inventor: Hiroyuki Utsunomiya, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/672,578

(22) Filed: Aug. 9, 2017

(65) Prior Publication Data

US 2018/0047684 A1 Feb. 15, 2018

(30) Foreign Application Priority Data

Aug. 10, 2016 (JP) .................. 2016-157369

(51) Int. Cl.
| | | |
|---|---|---|
| *H01L 23/52* | (2006.01) | |
| *H01L 23/522* | (2006.01) | |
| *H01L 23/528* | (2006.01) | |
| *H01L 23/485* | (2006.01) | |
| *H01L 29/40* | (2006.01) | |
| *H01L 21/768* | (2006.01) | |
| *H01L 23/00* | (2006.01) | |

(52) U.S. Cl.
CPC ........ *H01L 24/05* (2013.01); *H01L 21/76838* (2013.01); *H01L 23/5226* (2013.01);
(Continued)

(58) Field of Classification Search
CPC ......... H01L 24/03; H01L 24/05; H01L 24/07; H01L 24/09; H01L 24/23; H01L 24/25; H01L 24/30; H01L 24/38; H01L 24/41; H01L 21/3205; H01L 21/76838; H01L 23/12; H01L 23/5221; H01L 23/5226; H01L 23/528; H01L 2924/351–35121; H01L 2924/206; H01L 2924/2064; H01L 2224/0501; H01L 2224/05011; H01L 2224/05012; H01L 2224/05013; H01L 2224/0554; H01L 2224/0555; H01L 2224/05552; H01L 2224/05554; H01L 2224/05541; H01L 2224/05553; H01L 2224/921; H01L 2224/9211; H01L 24/83; H01L 24/34; H01L 24/63–70; H01L 23/53233; H01L 23/5386; H01L 2224/05006; H01L 2224/05008;
(Continued)

(56) References Cited

U.S. PATENT DOCUMENTS 5,289,036 A * 2/1994 Nishimoto ............ H01L 23/528
257/734
5,793,100 A * 8/1998 Takahashi ......... H01L 23/49565
257/669
(Continued)

FOREIGN PATENT DOCUMENTS

| JP | 2004-22653 A | 1/2004 | |
|---|---|---|---|
| JP | 2010-272810 A | 12/2010 | |
| JP | 2010272810 A * | 12/2010 | ............. H01L 23/52 |

*Primary Examiner* — Natalia A Gondarenko
(74) *Attorney, Agent, or Firm* — Brinks Gilson & Lione

(57) ABSTRACT

A slit is formed along a coupling portion at which a second interconnect is connected to a relatively large area interconnect or pad. Since tensile stress of a resist that is caused due to baking, UV curing, or other treatments in photolithography can be dispersed, contraction and deformation of the resist at an end of the second interconnect can be alleviated, and dimensions and shape of a interconnect, which is formed by etching, can be stabilized.

8 Claims, 5 Drawing Sheets

(52) U.S. Cl.
CPC .... *H01L 24/03* (2013.01); *H01L 2224/05553* (2013.01); *H01L 2924/351* (2013.01)

(58) Field of Classification Search
CPC ..... H01L 2224/0509; H01L 2224/0612; H01L 2224/06148; H01L 2224/06152; H01L 2224/06168; H01L 2224/08053; H01L 2224/08113; H01L 2224/0812; H01L 2224/0903; H01L 2224/09051; H01L 2224/09055; H01L 2224/06158; H01L 2224/214; H01L 2224/221; H01L 2224/32014; H01L 2224/3303; H01L 2224/33051; H01L 2224/33055; H01L 2224/4103; H01L 2224/41051; H01L 2224/08058; H01L 2224/224; H01L 2224/32013; H01L 2221/1015; H01L 2221/1026; H01L 2221/1031; H01L 2221/1057; H01L 2221/1068; H01L 2221/1078
USPC ....... 257/774, 775, 776, 758, 773, 734, 377, 257/508, 750, 762, 178; 438/638, 619, 438/637, 667, 672, 687, 926, 622
See application file for complete search history.

(56) References Cited

U.S. PATENT DOCUMENTS

| | | | | |
|---|---|---|---|---|
| 6,936,926 | B2* | 8/2005 | Matsubara | H01L 21/76838 257/773 |
| 7,042,097 | B2* | 5/2006 | Yao | H01L 21/76838 257/734 |
| 8,056,039 | B2* | 11/2011 | Chanda | H01L 23/528 257/767 |
| 8,791,570 | B2* | 7/2014 | Watanabe | H01L 23/522 257/758 |
| 2004/0173905 | A1* | 9/2004 | Kamoshima | H01L 21/76843 257/758 |
| 2005/0082677 | A1* | 4/2005 | Fan | H01L 23/528 257/774 |
| 2005/0121792 | A1* | 6/2005 | Harada | H01L 21/76802 257/758 |
| 2005/0269712 | A1* | 12/2005 | Yamada | H01L 23/528 257/775 |
| 2006/0019414 | A1* | 1/2006 | Wang | G01R 31/2853 438/14 |
| 2010/0096760 | A1* | 4/2010 | Yu | H01L 24/05 257/774 |

* cited by examiner

US 10,483,223 B2

SEMICONDUCTOR DEVICE HAVING A LARGE AREA INTERCONNECT OR PAD

RELATED APPLICATIONS

This application claims priority under 35 U.S.C. § 119 to Japanese Patent Application No. 2016-157369 filed on Aug. 10, 2016, the entire content of which is hereby incorporated by reference.

BACKGROUND OF THE INVENTION

1. Field of the Invention

The present invention relates to a semiconductor device having a large area interconnect or a large area pad to which a narrow interconnect is connected.

2. Description of the Related Art

Semiconductor elements and interconnects are formed by piling up, on a semiconductor substrate, processes for making insulating films, conductive films, or the like into desired shapes. In general, a resist pattern is formed on a selected film by photolithography, and then a process including etching is performed to obtain desired patterns or desired dimensions using the resist pattern as a mask. In etching the resist pattern is subjected to baking, UV curing, or other treatments for the purpose of improving the adhesion and etching resistance of the resist.

In a formation of a narrow interconnect connected to a large area interconnect or pad, however, the following problem arises. As illustrated in FIG. 4, a resist pattern corresponding to a large area interconnect or pad 1 contracts toward the center of the resist because a resist pattern formed on a metal film by photolithography is subjected to baking or UV curing in the processes. The contraction ratio of the resist pattern is high at its upper portion, and the gradient at the end portion of the resist pattern reduces depending on the contraction ratio of the resist. It is thus difficult to stably form a large area interconnect or pad having desired dimensions and shape by etching without, for example, the distortion of the outer peripheral portion of the interconnect or pad 1. The narrow interconnect 2 connected to the large area interconnect or pad 1 contracts itself, and in addition, is affected by the contraction of the large area interconnect or pad 1, with the result that the resist pattern greatly contracts. Similarly to the large area interconnect or pad 1, the gradient at the end of the resist pattern reduces, and it is thus difficult to stably form a narrow interconnect having desired dimensions and shape by etching. The narrow interconnect 2 is originally supposed to be formed to cover an uncovered portion 8. However, the narrow interconnect 2 does not completely cover a VIA contact 5, and the VIA contact 5 is thus partially exposed.

SUMMARY OF THE INVENTION

The present invention has an object to provide a semiconductor device on which a stably formation of a narrow interconnect which has desired dimensions and shape and which is connected to a large area interconnect or pad is possible.

In order to achieve the above-mentioned object, a semiconductor device has a slit formed along a coupling portion at which a large area interconnect or pad and a narrow interconnect are connected to each other.

According to the present invention, in forming a narrow interconnect connected to a large area interconnect or pad, the interconnect having desired dimensions and shape can be formed.

DETAILED DESCRIPTION OF THE PREFERRED EMBODIMENTS

Now, embodiments of the present invention are described with reference to the drawings.

Figure 1:
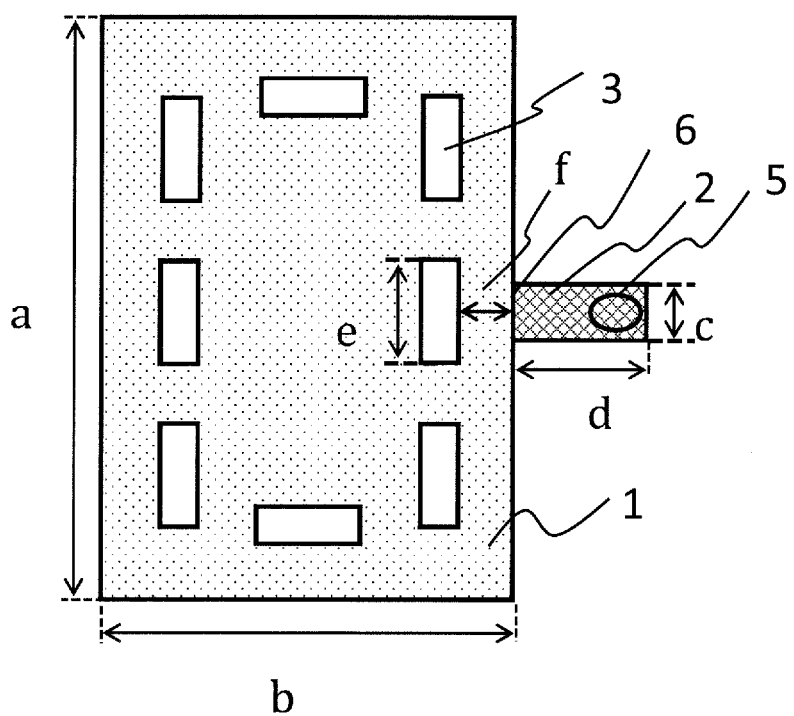
FIG. 1 is a plan view of a semiconductor device according to a first embodiment of the present invention.

FIG. 1 is a plan view of a semiconductor device according to a first embodiment of the present invention for illustrating a metal interconnect on an insulating film in the semiconductor device. The metal interconnect is arranged on the insulating film formed on the surface of a semiconductor substrate, constituting a semiconductor device together with semiconductor elements. A first interconnect or pad 1 which is a large area interconnect having a width 'a' equal to or larger than 50 µm in a vertical direction (first direction) and a width 'b' equal to or larger than 50 µm in a horizontal direction (second direction), and a narrow second interconnect 2 connected to the first interconnect or pad 1 are illustrated. The narrow second interconnect 2 is formed of the same layer as the first interconnect 1. One end of the second interconnect 2 is connected to the first interconnect 1 at a coupling portion 6, and in the vicinity of the other end of the second interconnect 2, which is on the opposite side to the one end, a VIA contact 5 is formed. The VIA contact 5 is covered with the second interconnect 2 and is not exposed.

The line width c of the second interconnect 2 is narrower than the widths 'a' and '130' of the first interconnect or pad 1 in the vertical and horizontal directions. In the first interconnect or pad 1, a slit 3 is formed along the coupling portion 6 at which the first interconnect or pad 1 and the second interconnect 2 are connected to each other. Here, a distance f from the coupling portion 6 to the slit 3 is desirably equal to or smaller than 20 µm. However, when the slit 3 is formed along the second interconnect 2 in this way, it is conceivable that current density locally increases so that the life of the interconnect may shorten due to migration. It is accordingly desired that the distance f between the slit 3 and the second interconnect 2 is larger than the line width c of the second interconnect 2.

A length e of the slit 3 is desirably larger than the line width c of the second interconnect 2, but an effect can be obtained to the length e between a half of the line width c of the second interconnect 2 to the line width c. In addition, as illustrated in FIG. 1, one vertically long slit is desirably formed to correspond to a line width direction of the second interconnect 2. However, the slit 3 may be divided, and in such a case, the effect is obtained when the sum of the length of the divided slits is equal to or larger than the above-mentioned value. One small slit obtained through the division desirably has a length of at least about 2 μm.

Although depending on the large area interconnect or pad 1 and the line width c of the second interconnect 2, stress is strong when a length d of the second interconnect 2 is small, and an effect of the slit 3 is obtained when the length d of the second interconnect 2 falls within a range of about 20 μm or smaller, for example.

Further, in FIG. 1, a plurality of slits 3 are formed in the first interconnect or pad 1 in addition to the slit 3 formed along the second interconnect 2. The influence of those slits 3, which are formed in portions other than the coupling portion 6, on the slit 3 formed along the second interconnect 2 is small, and hence the arrangement of the slits 3 is not limited. That is, the plurality of slits 3 may be uniformly or randomly formed in the first interconnect or pad 1. As a matter of course, the slit 3 may only be formed along the second interconnect 2.

Hereafter, effect of the slit 3 formed in the first interconnect or pad 1 is described.

When no slit is formed, in photolithography, such a wide resist pattern is formed as to expand over a line width b of a first interconnect or a pad in the second direction and a length d of a second interconnect, and the resist pattern has a very gentle slope at the end of the second interconnect in cross section. This is because the resist pattern contracts in baking or UV curing. When no slit is formed, because such a wide resist pattern is formed as to expand over the line width b and the length d of the second interconnect, the contraction greatly affects the end portion of the resist pattern. In contrast to this, when the slit 3 is formed in the first interconnect or pad 1 as in the first embodiment, the wide resist pattern is divided by the slit 3, and hence the influence of the contraction of the resist pattern, which is caused due to baking or UV curing, is small. When the resist pattern has a gentle slope as in the case where no slit is formed, the thickness of the resist at the slope is smaller than an original thickness that is necessary for etching of a interconnect, resulting in defects of the second interconnect. However, in the first embodiment, the resist can have a thickness that prevents the defects due to etching, and the VIA contact 5 is thus not exposed.

Figure 2:
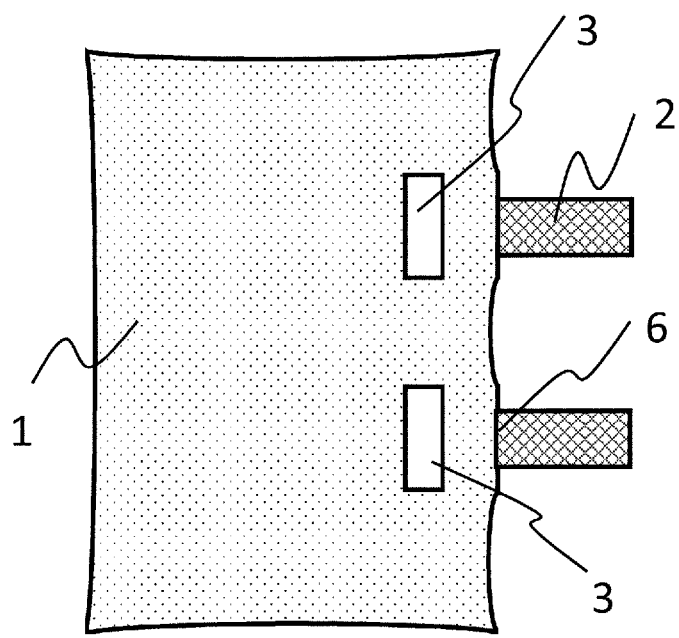
FIG. 2 is a plan view of a semiconductor device according to a second embodiment of the present invention.

FIG. 2 is a plan view of a semiconductor device according to a second embodiment of the present invention.

The second embodiment differs from the first embodiment in that a plurality of second interconnects 2 are formed on one side of a first interconnect or pad 1. Slits 3 are formed along respective coupling portions 6 at which the plurality of second interconnects 2 are connected to the first interconnect or pad 1. In FIG. 2, the slits 3 are only formed along the coupling portions 6 with the plurality of second interconnects 2, but the slits 3 may be formed along the side of the first interconnect or pad 1 as in FIG. 1. With this, the first interconnect or pad 1 is formed to have an end portion with a desired shape.

Figure 3A:
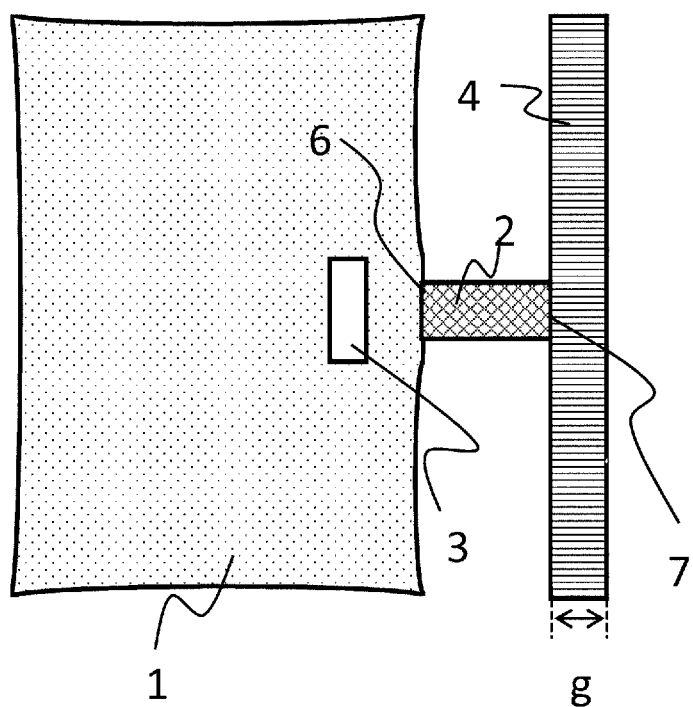
FIG. 3A is a plan view of a semiconductor device according to a third embodiment of the present invention.
Figure 3B:
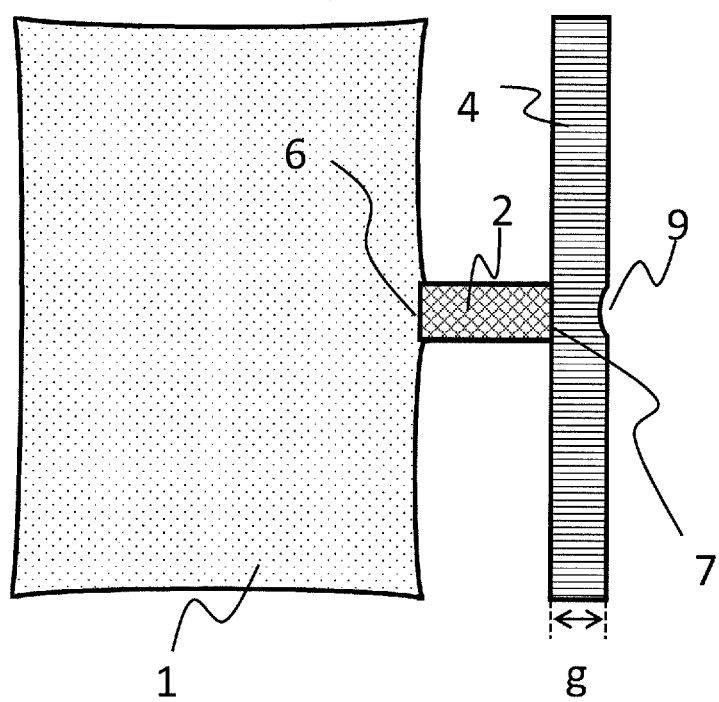
FIG. 3B is a plan view of a semiconductor device according to the related art.
Figure 4:
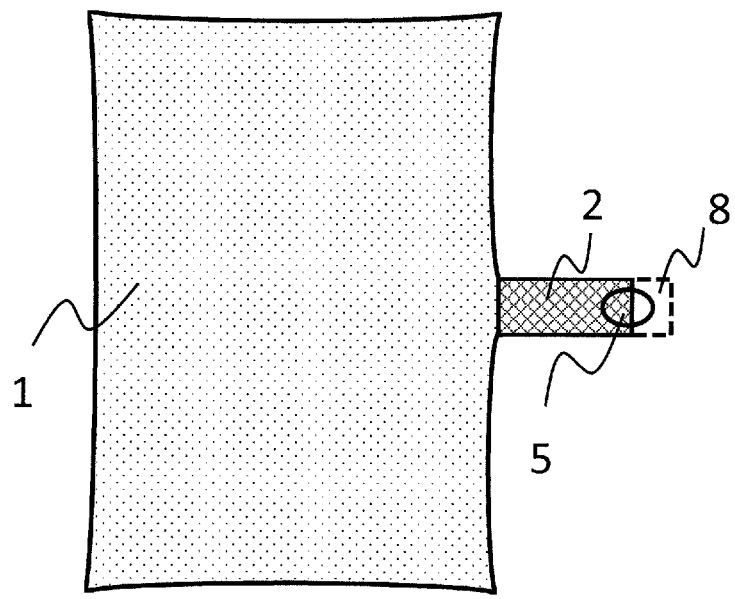
FIG. 4 is a plan view of a semiconductor device of the related art.

FIG. 3A and FIG. 3B are plan views of semiconductor devices according to a third embodiment of the present invention and the related art, respectively.

The third embodiment differs from the first embodiment in that a second interconnect 2 is connected to a third interconnect 4 at its end on the opposite side to one end connected to a first interconnect 1. FIG. 3A is a view of the third embodiment, whereas FIG. 3B is a view of the related art.

First, description is given with reference to FIG. 3B. A second interconnect 2 is connected to a large area first interconnect or pad 1 at a first coupling portion 6, and is connected to a third interconnect 4 at a second coupling portion 7. The third interconnect 4 is a narrow interconnect having a line width g. After a metal film is formed on a semiconductor substrate, a resist pattern is formed on the metal film by photolithography. Then, the resist pattern contracts in baking or UV curing, and the resist pattern is drawn toward the first interconnect or pad 1, with the result that the thickness of the resist pattern of the third interconnect 4 is greatly reduced at a portion on the opposite side to the second coupling portion 7. The thickness of this thin portion of the resist is insufficient for etching, and a defect 9 thus occurs in part of the third interconnect 4 in etching. As a result, current density increases at the defect portion 9 so that the life of the interconnect may be shortened due to electromigration.

In FIG. 3A, an illustration of the third embodiment, a slit 3 is formed along a first coupling portion 6 in the first interconnect or pad 1, and the contraction of a resist pattern is alleviated due to the formation of the slit 3. The resist pattern has a steep sectional shape at its end portion corresponding to the defect portion 9 of FIG. 3B, and the resist can have an enough thickness not to be damaged due to etching. Thus, defects are prevented, and further, the fear of the shortage of the life of the interconnect due to electromigration is eliminated.

A similar effect is obtained by forming the slit 3 even when the second interconnect 2 and the third interconnect 4, which are connected to each other to form a T shape in FIG. 3A, are connected to each other to form an L shape.

As described above, according to the present invention, an interconnect having desired dimensions and shape can be formed.

What is claimed is:
1. A semiconductor device, comprising:
a semiconductor substrate;
an insulating film on a surface of the semiconductor substrate;
a first interconnect on the insulating film and having a first width in a first direction and a second width in a second direction, the second direction orthogonal to the first direction;
a second interconnect having a length in the second direction of equal to or less than 20 microns and having a third width in the first direction, wherein the third width is smaller than the first width and the second width, and the second interconnect is coupled to the first interconnect at a first coupling portion between the first interconnect and one end of the second interconnect, the first coupling portion extending in the first direction;
a slit in the first interconnect spaced away from the first coupling portion by a length of equal to or less than 20 microns, and having a fourth width that is half or more of the third width; and
a third interconnect coupled to a terminal end of the second interconnect on an opposite side to the first coupling portion, wherein the third interconnect comprises a same layer as the first interconnect and the second interconnect and extends along the first direction.
2. The semiconductor device according to claim 1, further comprising a plurality of slits extending in the first direction, at least two of which extend along a common center line in the first direction.

3. The semiconductor device according to claim 1;
wherein the second interconnect comprises a plurality of second interconnects on one side of the first interconnect, and
wherein the slit comprises a plurality of slits each along the first coupling portion between the first interconnect and the one end of each of the plurality of second interconnects.

4. A semiconductor device, comprising:
a semiconductor substrate;
an insulating film on a surface of the semiconductor substrate;
a pad on the insulating film and having a first width in a first direction and a second width in a second direction, the second direction orthogonal to the first direction;
a second interconnect having a length in the second direction of equal to or less than 20 microns and having a third width in the first direction, wherein the third width is smaller than the first width and the second width, and the second interconnect is coupled to the pad at a first coupling portion between the pad and one end of the second interconnect, the first coupling portion extending in the first direction;
a slit in the pad at a location away from the first coupling portion by a length of equal to or less than 20 microns, and having a fourth width which is half or more of the third width; and
a third interconnect coupled to a terminal end of the second interconnect on an opposite side to the one end and extending along the first direction,
wherein the third interconnect comprises a same layer as the pad and the second interconnect.

5. The semiconductor device according to claim 4, further comprising a plurality of slits in the first direction, at least two of which extend along a common center line in the first direction.

6. The semiconductor device according to claim 4;
wherein the second interconnect comprises a plurality of second interconnects on one side of the pad, and
wherein the slit comprises a plurality of slits each along the first coupling portion between the pad and the one end of each of the plurality of second interconnects.

7. The semiconductor device according to claim 1, wherein the slit is along a line extending from the second interconnect in the second direction.

8. The semiconductor device according to claim 2, wherein the slit is along a line extending from the second interconnect in the second direction.

* * * * *